(12) United States Patent
Subramanian et al.

(10) Patent No.: US 6,306,769 B1
(45) Date of Patent: Oct. 23, 2001

(54) USE OF DUAL PATTERNING MASKS FOR PRINTING HOLES OF SMALL DIMENSIONS

(75) Inventors: Ramkumar Subramanian; Marina Plat, both of San Jose, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/494,698

(22) Filed: Jan. 31, 2000

(51) Int. Cl.$^7$ .................................................. H01L 21/311
(52) U.S. Cl. .......................... 438/702; 438/622; 438/637; 438/638
(58) Field of Search .................. 355/18, 35; 438/589, 438/597, 618, 622, 637, 638, 700, 702

(56) References Cited

U.S. PATENT DOCUMENTS

| | | | |
|---|---|---|---|
| 5,604,156 | * 2/1997 | Chung et al. | 438/620 |
| 5,869,395 | * 2/1999 | Yim | 438/637 |
| 5,935,762 | * 8/1999 | Dai et al. | 430/312 |
| 5,936,707 | 8/1999 | Nguyen et al. | 355/18 |
| 6,025,116 | * 2/2000 | Grassmann | 430/313 |
| 6,147,005 | * 11/2000 | Tu et al. | 438/706 |
| 6,150,256 | * 11/2000 | Furukawa et al. | 438/618 |
| 6,156,640 | * 12/2000 | Tsai et al. | 438/636 |
| 6,169,028 | * 1/2001 | Wang et al. | 438/653 |
| 6,187,661 | * 2/2001 | Lou | 438/622 |
| 6,187,663 | * 2/2001 | Yu et al. | 438/624 |

OTHER PUBLICATIONS

P. Singer, Dual–Damascene Challenges Dielectric–Etch, Semiconductor International, Aug. 1999.*
R. DeJule, Dual–Damascene: Overcoming Process Issues, Semiconductor International, Jun. 2000.*
Verove et al., Dual damascene architectures evaluation for the 0.18μm technology and below, Proc. of the IEEE 2000 Intern. Interconnect Tech. Conf., Jun. 2000, pp. 267–269.*

* cited by examiner

Primary Examiner—Vu A. Le
Assistant Examiner—Christian D. Wilson
(74) Attorney, Agent, or Firm—Amin & Turocy, LLP (57) ABSTRACT

The present invention addresses a problem associated with exposing a photoresist layer of non-uniform thickness. Oftentimes, trench patterns etched into a layer of a semiconductor structure will have trenches of varying sizes. Larger trenches in the structure become filled with photoresist material, while smaller trenches do not leading to non-uniformity of photoresist layer thickness with respect to the large and small trenches. The present invention addresses this non-uniformity in photoresist layer thickness by employing at least two exposure steps when exposing the photoresist layer. A first exposure step exposes portions of the photoresist layer corresponding to the large trenches using a first reticle and first energy level. Next, a second exposure step exposes portions of the photoresist layer corresponding to the small trenches using a second reticle and second energy level. The first and second energy levels corresponding to proper exposure of the respective photoresist layer portions of different thicknesses.

12 Claims, 5 Drawing Sheets

USE OF DUAL PATTERNING MASKS FOR PRINTING HOLES OF SMALL DIMENSIONS

TECHNICAL FIELD

The present invention generally relates to semiconductor processing, and in particular to a method for improving a dual damascene process.

BACKGROUND OF THE INVENTION

The escalating requirements for density and performance associated with ultra large scale integration (ULSI) circuits require responsive changes in interconnection technology which is considered a very demanding aspect of ULSI technology. High density demands for ULSI integration require planarizing layers with minimal spacing between conductive lines.

Single damascene is a technique developed to address disadvantages (e.g., poor metal step coverage, residual metal shorts, low yields, uncertain reliability, and poor ULSI integration extendability) associated with traditional etch back methods. Damascene, an art which has been employed for centuries in the fabrication of jewelry, has been adapted for application in the semiconductor industry. Damascene basically involves the formation of a trench which is filled with a metal. Thus, damascene differs from traditional etch back methods which involve building up a metal wiring layer and filling the interwiring spaces with a dielectric material.

Single damascene techniques offer the advantage of improved planarization as compared to etch back methods; however, single damascene is time consuming in that numerous process steps are required. Undesirably, an interface exists between the conductive via and conductive wiring. Moreover, adequate planarization layers containing an interwiring spacing less than 0.35 $\mu$m are difficult to achieve.

An improvement to single damascene is dual damascene which involves substantially simultaneous formation of a conductive via and conductive wiring. The dual damascene technique requires less manipulative steps than the single damascene technique and eliminates the interface between the conductive via and conductive wiring which is typically formed by the single damascene technique. In very and ultra large scale integration (VLSI and ULSI) circuits, an insulating or dielectric material, such as silicon oxide, of the semiconductor device in the dual damascene process is patterned with several thousand openings for the conductive lines and vias which are filled with metal, such as aluminum, and serve to interconnect active and/or passive elements of the integrated circuit. The dual damascene process also is used for forming multilevel signal lines of metal, such as copper, in the insulating layers, such as polyimide, of multilayer substrate on which semiconductor devices are mounted.

A conventional dual damascene process includes covering an insulating layer with a photoresist material layer which is exposed to a first mask with an image pattern of via openings, and anisotropically etching the pattern in the upper half of the insulating layer. The patterned photoresist material layer is then removed and the insulating layer is coated with a second photoresist material layer which is exposed to an a second mask with an image pattern of trenches in alignment with the via openings. In anisotropically etching the trenches in the upper half of the insulating material, the via openings already present in the upper half are simultaneously etched in the lower half of the insulating material. After the etching is complete, both the vias and trenches are filled with metal to form contacts and conductive lines. Although this standard dual damascene technique offers advantages over other processes for forming interconnections, it has a number of disadvantages, such as the edges of the via openings and the sidewalls of the via in the lower half of the insulating layer are poorly defined because of the two etchings and the via edges and sidewalls being unprotected during the second etching.

An improvement over the conventional dual damascene process is a process known as a back end integration or a trench first via last (TFVL) dual damascene process. In this process, the trenches are etched first and the vias are etched last. Although, this eliminates some of the problems with the poorly defined edges, the process creates other problems. For example, the etching of the trenches includes etching both small and large trenches. Small trenches have widths that are not much larger than the vias, while large trenches have widths much larger than the vias. During a via patterning step, portions of the photoresist material flows into the large trenches causing an non-uniform thickness over the large trenches. Due to the fact that the exposure of the photoresist material layer is very sensitive to the energy and the wavelength of the light source used to expose the photoresist material layer, the thicker portions of the photoresist material layer do not become fully exposed resulting in undesirable defects during the etching step. Using a higher energy for thicker resist and the remaining resist results in an unacceptable result.

In view of the above, improvements are needed to mitigate exposure defects associated with back end integration or TFVL dual damascene processes.

SUMMARY OF THE INVENTION

The present invention relates to a system and method for fabricating vias in a back end integration or TFVL dual damascene process. In particular, the present invention addresses a problem associated with exposing a photoresist layer of non-uniform thickness. Oftentimes, trench patterns etched into a layer of a semiconductor structure will have trenches of varying sizes. The ever increasing demand for smaller feature sizes has resulted in certain trenches being formed which are too small for photoresist formed thereover to fill the small trenches. As a result, larger trenches in the structure become filled with photoresist material, while smaller trenches do not leading to non-uniformity of photoresist layer thickness with respect to the large and small trenches. The present invention addresses this non-uniformity in photoresist layer thickness by employing at least two exposure steps when exposing the photoresist layer. A first exposure step exposes portions of the photoresist layer corresponding to the large trenches using a first reticle and a first energy level. Next, a second exposure step exposes portions of the photoresist layer corresponding to the small trenches using a second reticle and a second energy level. The first and second energy levels corresponding to proper exposure of the respective photoresist layer portions of different thicknesses.

With respect to edge contacts, either of the first or second reticles may be employed to expose portions of the photoresist layer corresponding to edge contacts whether or not the edge contact is associated with a large or small trench. This is because the thickness of the photoresist layer at edges of the trenches is substantially the same thickness for large trenches and small trenches. The energy level employed will correspond to the thickness of the photoresist layer portions corresponding to the edge contacts.

In accordance with a particular aspect of the present invention, a photoresist layer is applied on a layer having large trenches and small trenches. A light source operating at a first energy level exposes a pattern of vias on the photoresist layer overlying at least a portion of the large trenches using a first reticle. The light source operating at a second energy level exposes a pattern of vias on the photoresist layer overlying at least a portion of the small trenches using a second reticle. The first energy level is different than the second energy level, so that the non-uniform thickness of the photoresist layer over the large and small trenches, respectively, can be exposed adequately for etching vias corresponding to the large trenches and the small trenches.

In an alternate aspect of the invention, the photoresist layer is exposed with a light source operating at a first wavelength for patterning vias on the photoresist layer overlying at least a portion of the large trenches on the insulating layer using a first reticle. A light source operating at a second wavelength exposes a pattern of vias on the photoresist layer overlying at least a portion of the small trenches on the insulating layer using a second reticle.

One aspect of the invention relates to a method of fabricating vias. The method comprises the steps of forming a photoresist layer over a structure including at least one large trench opening and at least one small trench opening, patterning portions of the photoresist layer corresponding to the at least one large trench opening using a first reticle and patterning portions of the photoresist layer corresponding to the at least one small trench opening using a second reticle.

Another aspect of the present invention relates to a system for fabricating vias in a structure having at least one large trench opening and at least one small trench opening. The system comprises at least one light source for exposing a photoresist layer, a first reticle adapted to pattern portions of the photoresist layer corresponding to the at least one large trench opening, and a second reticle adapted to pattern portions of the photoresist layer corresponding to the at least one small trench opening.

Still another aspect of the present invention relates to a method of fabricating; vias in a trench first via last (TFVL) dual damscene process. A photoresist layer is formed over a layer having at least one trench of a first size and at least one trench of a second size. Portions of the photoresist layer are patterned with at least one via corresponding to the at least one trench of a first size using a first reticle at a first energy. Portions of the photoresist layer are patterned with at least one via corresponding to the at least one trench of a second size using a second reticle at a second energy. The first energy level is different than the second energy level.

Yet another aspect of the present invention relates to a system for fabricating vias in a structure including at least one large trench opening and at least one small trench opening. The system comprises means for exposing a photoresist layer disposed over the structure, means for patterning portions of the photoresist layer corresponding to the at least one large trench opening and means for patterning portions of the photoresist layer corresponding to the at least one small trench opening.

Another aspect of the present invention relates to a method of fabricating small and large trenches in a substrate. A photoresist layer is formed over the substrate. A first reticle is used to pattern portions of the photoresist layer corresponding to forming small trenches in the substrate; and a second reticle is used to pattern portions of the photoresist layer corresponding to forming large trenches in the substrate.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now described with reference to the drawings, wherein like reference numerals are used to refer to like elements throughout. The present invention is described with reference to a system and method of providing a dual damascene process. It should be understood that the description of the various aspects of the present invention are merely illustrative and that they should not be taken in a limiting sense.

Figure 1A:
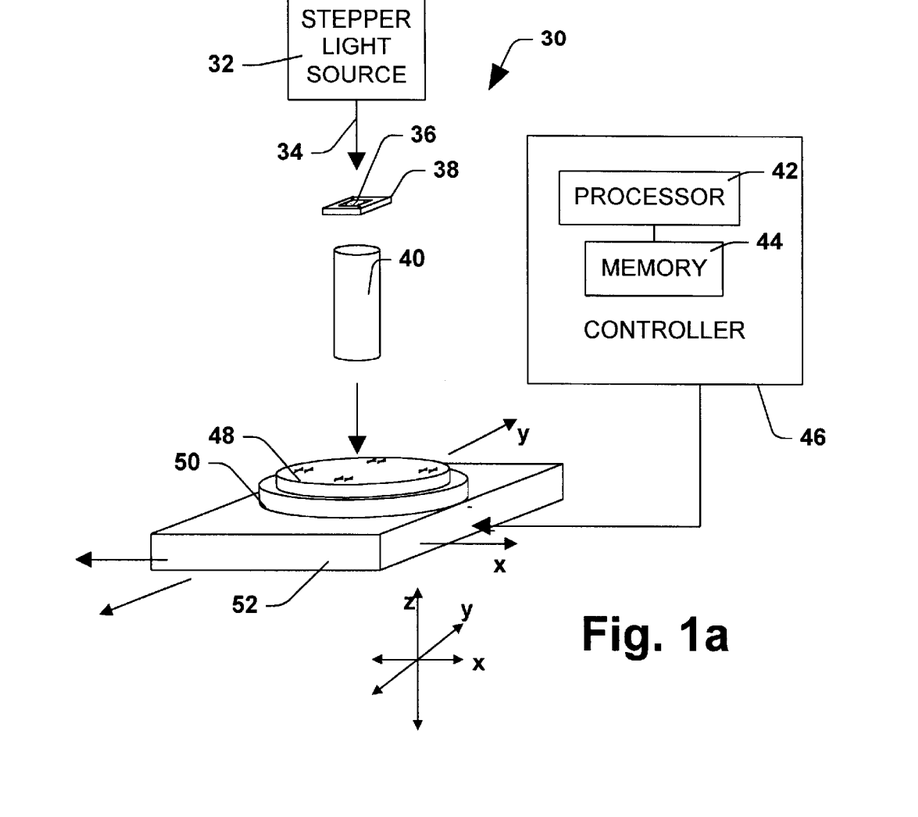
FIG. 1a is representative schematic illustration of a light exposure system in accordance with one aspect of the present invention.

FIG. 1a illustrates a representative stepper system 30 for selectively irradiating a photoresist material layer with a desired trench pattern in a back end integration dual damascene process or a trench first via last (TFVL) dual damascene process. The system 30 includes a reticle 38 with a pattern 36. A stepper light source 32 projects light 34 through the reticle 38 so as to project the pattern 36 onto a portion of a wafer 48. The light 34 from the stepper light source 32 passes through the reticle 38 and through the optical axis of a projection lens system 40. The projection lens system 40 projects the pattern 36 of the reticle 38 onto the wafer 48 while in most cases substantially reducing the imaged pattern. Typically, a wafer holder 50 vacuum-adsorbs the wafer 48 and is provided for slight rotation relative to a stage 52 two-dimensionally moveable in x-direction and y-direction. The stage 52 and wafer holder 50 are controlled by a controller 46. The controller 46 effects rotation of the wafer holder 50 and movement of the stage 52 (via a plurality of motors (not shown)) for wafer alignment and positioning. The controller 46 includes a processor 42 which is programmed to control and operate the various components within the system 30 in order to carry out various functions. A memory 44 which is operatively coupled to the processor 42 can also be included in the controller 46 and serves to store program code executed by the processor 42 for carrying out operating functions of the system 30.

Figure 1B:
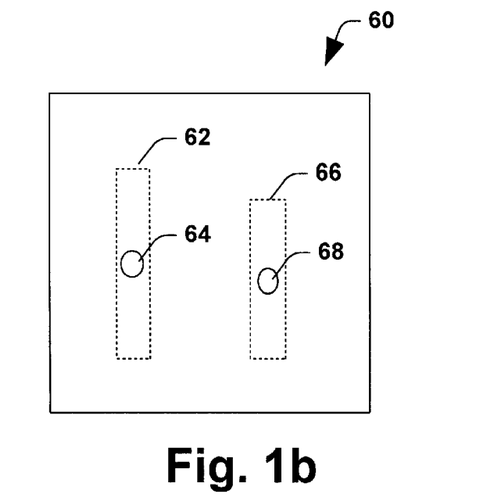
FIG. 1b is a plan view of a portion of a first reticle mask for patterning vias for small trenches in accordance with one aspect of the present invention.

Once the pattern (e.g., trench pattern) is formed on the photoresist material layer, the trench pattern can be etched into the wafer 48. The trench pattern may include small trenches and large trenches. The small trenches are too small for photoresist formed thereover to fill the small trenches. However, the large trenches become filled with photoresist material, such that a nonuniformity of the photoresist layer occurs due to the differences in small trenches and large trenches. A second photoresist material layer is then applied to the wafer 48. FIG. 1b illustrates a portion of a first reticle 60 for patterning the second photoresist material layer with vias corresponding to small trenches. The portion of the first reticle 60 includes a first via pattern 64 and a second via pattern 68, which will be patterned on the wafer 48, so that the first via pattern 64 and the second via pattern 68 lie within a first small trench 62 and a second small trench 66, respectively. The location of the first trench 62 and the second trench 66 are illustrated by the dashed lines on the portion of the first reticle 60. A first energy level of the stepper light source 32 is utilized for forming via patterns in the second photoresist material layer corresponding to the small trenches.

Figure 1C:
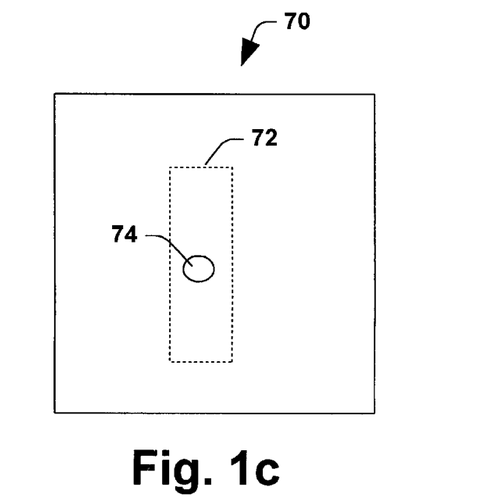
FIG. 1c is a plan view of a portion of a second reticle mask for patterning vias for large trenches in accordance with one aspect of the present invention.

FIG. 1c illustrates a portion of a second reticle 70 for patterning portions of the second photoresist material layer with vias corresponding to large trenches. The portion of the second reticle 70 includes a single via pattern 74, which will be patterned on the wafer 48, so that the single via pattern 74 lies within a single large trench 72. The location of the single large trench 72 is illustrated by the dashed lines on the portion of the second reticle 70. A second energy level different than the first energy level of the stepper light source 32 is utilized for forming via patterns in the second photoresist material layer corresponding to large trenches. Typically, the energy level corresponding to large trenches is greater than the energy level corresponding to small trenches.

FIGS. 2–14 illustrate one particular methodology for carrying out the present invention utilizing a back end integration or TFVL dual damascene method of forming contacts and vias on a substrate or wafer. With regard to the description in connection with FIGS. 2–14, the term substrate includes not only a semiconductor substrate, but also any and all layers and structures fabricated over the semiconductor substrate up to the point of processing under discussion. For ease of understanding, the present invention is described in connection with three trenches having two different sizes. It is to be appreciated that the invention may be applied to N number of trenches (N being an integer) having M number of sizes (M being an integer).

Figure 2:
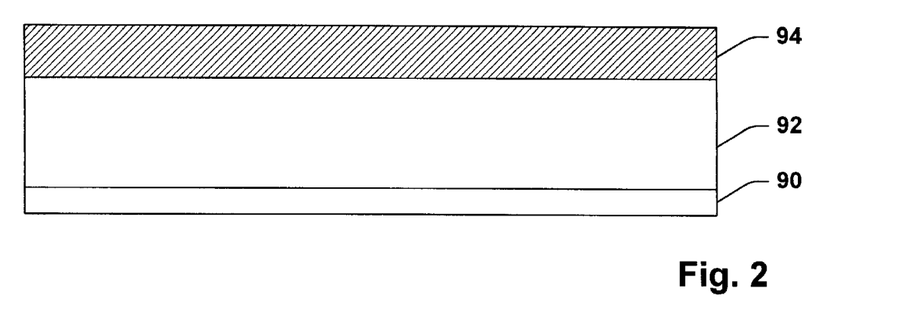
FIG. 2 is a schematic illustration of a semiconductor substrate covered with an insulating layer and a photoresist layer in accordance with the present invention.

FIG. 2 illustrates a semiconductor device including an insulating layer 92 which is formed on a semiconductor substrate 90. Semiconductor substrate 90 may be any suitable semiconductor material, for example, a monocrystalline silicon substrate. Any suitable technique (e.g., thermal oxidation, plasma enhanced chemical vapor deposition (CVD), thermal enhanced CVD and spin on techniques) may be employed in forming the insulating layer 92. Preferably, the insulating layer 92 is silicon dioxide ($SiO_2$) with a thickness of about 0.8 to 1.0 microns. Other usuable insulating materials are silicon nitride ($Si_3N_4$), (SiN), silicon oxynitride ($SiO_xN_y$), and fluonated silicon oxide ($SiO_xF_y$), and polyimide(s). It is to be appreciated that multiple insulating layers of oxides and nitrides can be implemented to carry out the present invention. For example, a single trench oxide layer and a single trench nitride layer can be etched to form the trenches and a single via oxide layer and a single via nitride layer can be disposed below the trench layers and etched to form the vias. The present example includes a single insulating layer for the sake of simplicity.

Figure 3:
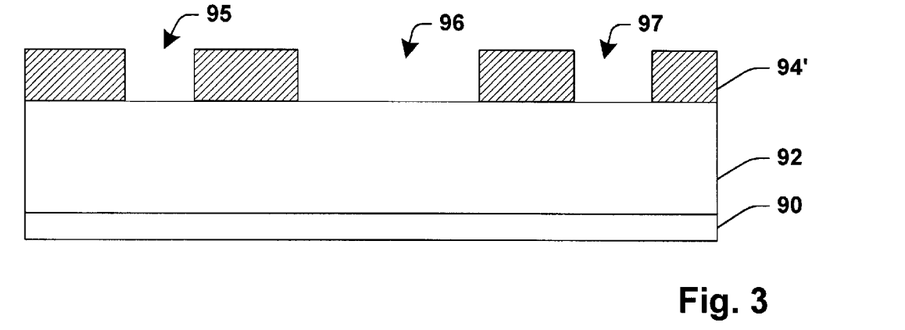
FIG. 3 is a schematic illustration of the structure of FIG. 2 after the photoresist layer has been patterned in accordance with the present invention.
Figure 4:
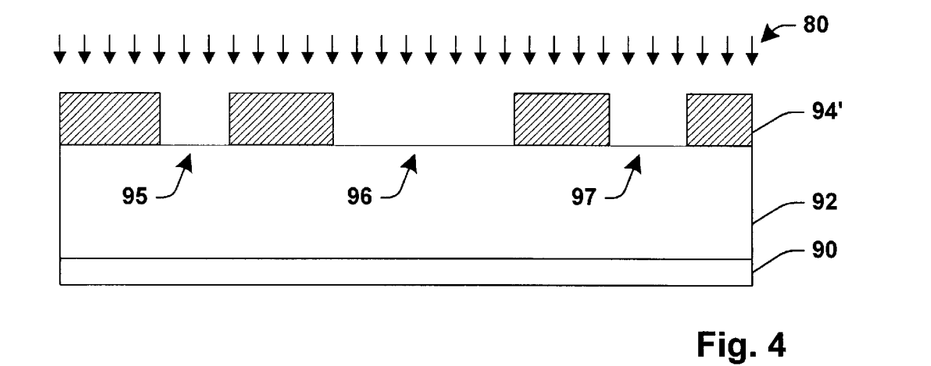
FIG. 4 is a schematic illustration of the structure of FIG. 3 undergoing an etching step in accordance with the present invention.
Figure 5:
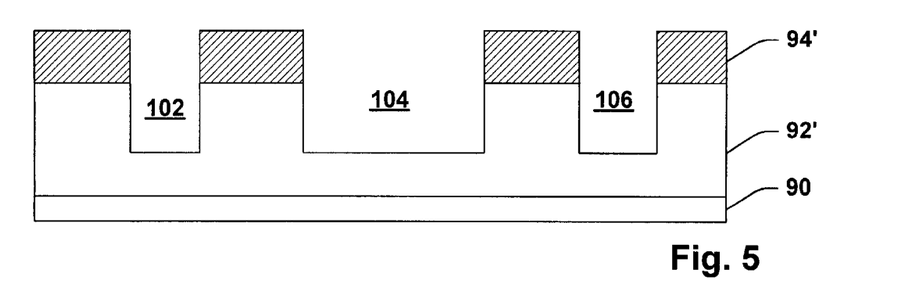
FIG. 5 is a schematic illustration of the structure of FIG. 4 after the etching step is substantially complete in accordance with the present invention.

A photoresist layer 94 is formed on the insulating layer 92. The photoresist layer 94 has a thickness suitable for functioning as a mask for etching the underlying insulating layer 92. The photoresist layer 94 is patterned using conventional techniques to form a first opening 95, a second opening 96 and a third opening 98 (FIG. 3). The size of the first opening 95 is about the size of the ultimate first small trench to be etched and the size of the third opening 97 is about the size of the ultimate second small trench to be etched in the underlying insulating layer 92. The size of the second opening 96 is about the size of the ultimate large trench to be etched in the underlying insulating layer 92. The patterned photoresist 94' serves as an etch mask layer for processing or etching the trenches into the underlying insulating layer 92.

An etch step 80 (e.g., anisotropic reactive ion etching (RIE)) (FIG. 4) is performed to form a first small trench 102, a second small trench 106 and a large trench 104 (FIG. 5) in the insulating layer 92. The patterned photoresist 94' is used as a mask for selectively etching the insulating layer 92 to provide a patterned insulating layer 92'. Any suitable etch technique may be used to etch the insulating layer 92. For example, the insulating layer 92 at the first opening 95, the second opening 96 and the third opening 97 is anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer 94' to thereby create the first small trench 102, the second small trench 106 and the large trench 104 in the insulating layer 92. Preferably, a selective etch technique is used to etch the material of the insulating layer 92 at a relatively greater rate as compared to the rate that the material of the patterned photoresist 94' is etched.

Figure 6:
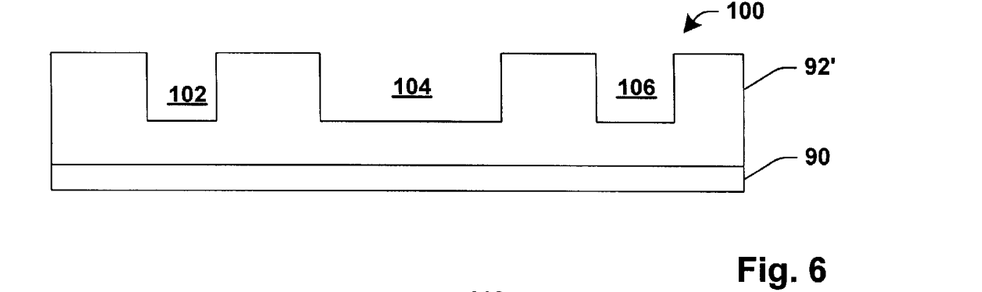
FIG. 6 is a schematic illustration of the structure of FIG. 5 after undergoing a stripping step to remove excess photoresist in accordance with the present invention.

FIG. 6 illustrates a partially complete dual damascene structure 100 after a stripping step (e.g., ashing in an $O_2$ plasma) is substantially complete to remove remaining portions of the patterned photoresist layer 94'.

Figure 7:
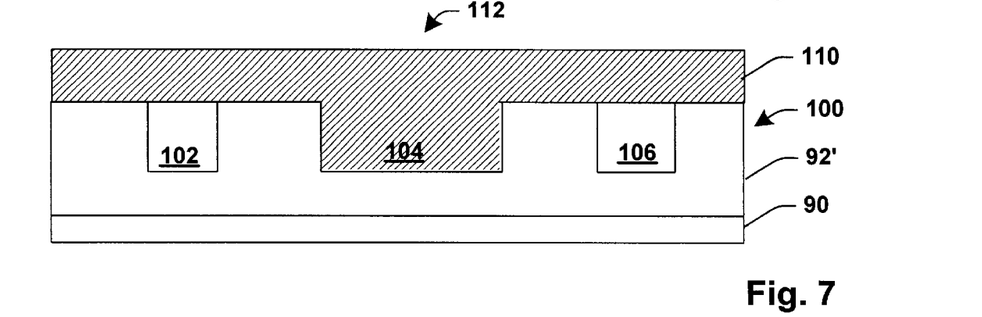
FIG. 7 is a schematic illustration of the structure of FIG. 6 after a second photoresist layer has been formed on the structure in accordance with the present invention.
Figure 8:
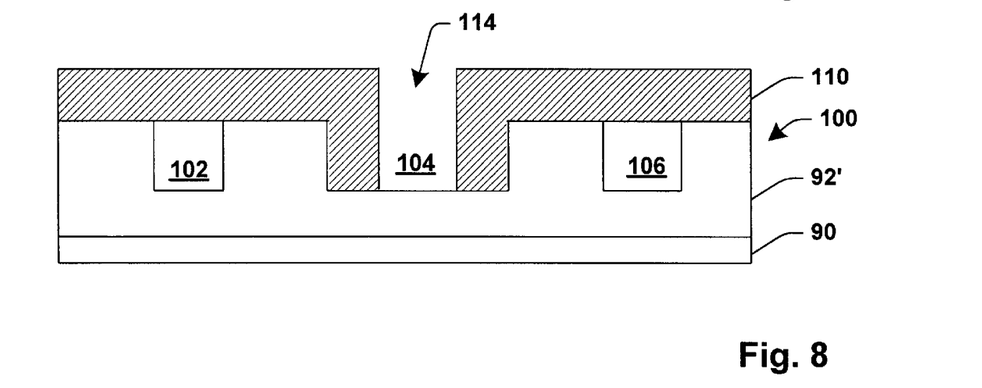
FIG. 8 is a schematic illustration of the structure of FIG. 7 after the second photoresist layer has been patterned with a first reticle for vias corresponding to large trenches in accordance with the present invention.

FIG. 7 illustrates a second photoresist layer 110 formed on the structure 100. The photoresist layer 110 has a thickness of about 500 Å–5000 Å, however, it is to be appreciated that the thickness thereof may be of any dimension suitable for carrying out the present invention. Accordingly, the thickness of the photoresist layer 110 can vary in correspondence with the wavelength of radiation used to pattern the photoresist layer 110. One aspect of the present invention provides for forming the photoresist layer 110 to have a thickness within the range of 1000 Å to 4000 Å. Another aspect of the present invention provides for forming the photoresist layer 110 to have a thickness within the range of 2000 Å to 3000 Å. Yet another aspect of the present invention provides for forming the photoresist layer 110 to have a thickness within the range of 500 Å to 2000 Å. The photoresist layer 110 may be formed over the insulating layer 92 via conventional spin-coating or spin casting deposition techniques.

As illustrated in FIG. 7, the second photoresist layer 110 has a nonuniform thickness portion 112 over the large trench opening 104. The second photoresist layer 110 is patterned to form a first via opening 114 (FIG. 8) about the size of the ultimate via to be formed in the trench 104. Patterning of the second photoresist layer 110 for the first via opening 114 is accomplished using a first via mask at a first energy level. The second photoresist layer 110 is then patterned to form a second via opening 116 and a third via opening 118 (FIG. 9) about the size of the ultimate via to be formed in the first and second small trenches 102 and 106, respectively. Patterning of the second photoresist layer 110 for the second via opening 116 and the third via opening 118 is accomplished using a second via mask at a second energy level. The patterned photoresist 110' serves as an etch mask layer for processing or etching the vias into the underlying insulating layer 92'. The first energy level is higher than the second energy level to pattern the nonuniform thick portion 102 of the second photoresist material layer 110 with respect to the remaining portions of the second photoresist layer not disposed above the large trench 104.

Figure 9:
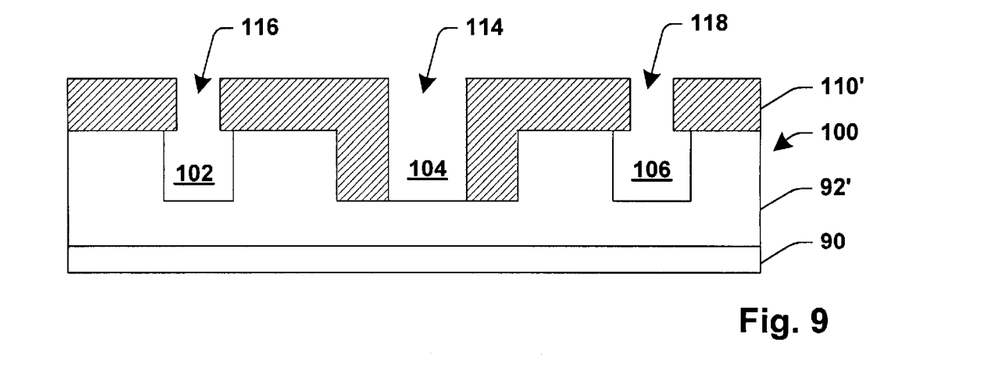
FIG. 9 is a schematic illustration of the structure of FIG. 8 after the second photoresist layer has been patterned with a second reticle for vias corresponding to small trenches in accordance with the present invention.
Figure 10:
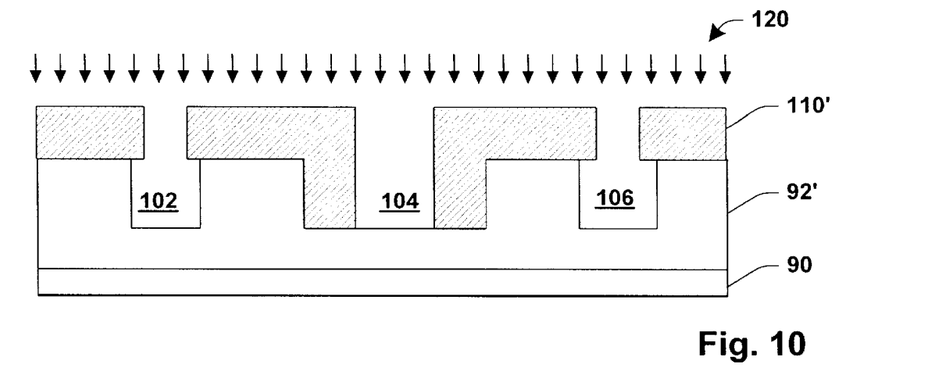
FIG. 10 is a schematic illustration of the structure of FIG. 9 undergoing a via etch step in accordance with the present invention.
Figure 11:
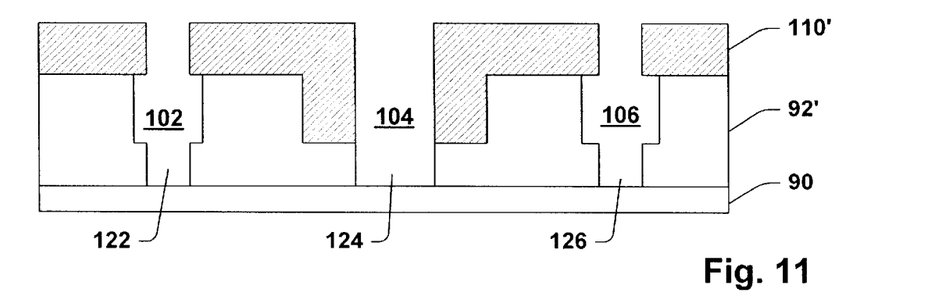
FIG. 11 is a schematic illustration of the structure of FIG. 10 after the via etch step is substantially complete in accordance with the present invention.

For example, for a light source with a wavelength of 248 nm, an energy level of 250 $mJ/cm^2$ can be used for the first energy level and an energy level of 200 $mJ/cm^2$ can be used for the second energy level. Alternatively, the first energy level can be greater than 200 $mJ/cm^{2}$ while the second energy level can be greater than 250 $mj/cm^2$. Variations of this example for wavelengths and energy levels based on the thickness of the second photoresist material layer 110 will be appreciated by those skilled in the art of semiconductor fabrication. It is to be appreciated that in an alternate aspect of the invention, a variation in the wavelength of the light source or utilizing light sources with different wavelengths for the vias in the large trenches verse the vias in the small trenches can be employed to carry out the present invention.

Figure 12:
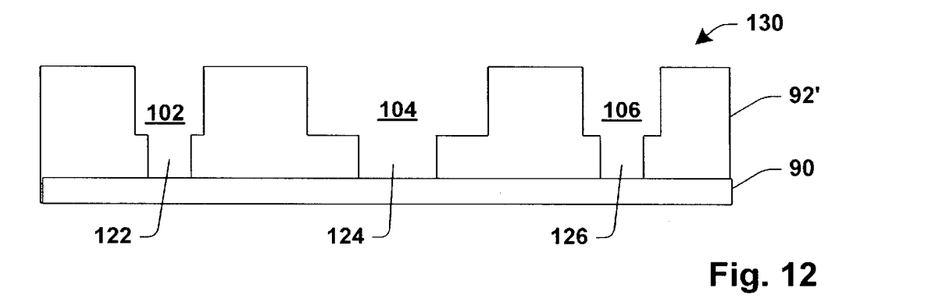
FIG. 12 is a schematic illustration of the structure of FIG. 11 after undergoing a stripping step to remove excess portions of photoresist material in accordance with the present invention.

A second etch step (preferably an anisotropic RIE step) 120 (FIG. 10) is performed using the second patterned photoresist material layer 110' as a mask to form the vias 122, 124 and 126 (FIG. 11) in the insulating layer 92'. FIG. 12 illustrates a partially complete dual damascene structure 130 after a stripping step (e.g., ashing in an $O_2$ plasma) is substantially complete to remove remaining portions of the patterned photoresist layer 110'.

Figure 13:
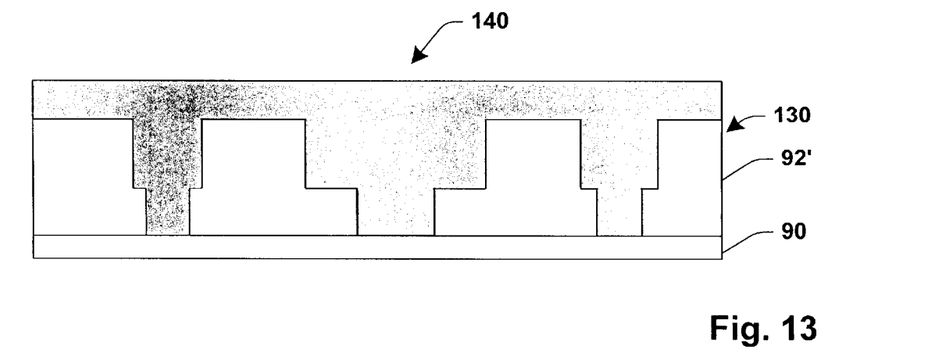
FIG. 13 is a schematic illustration of the structure of FIG. 12 undergoing a conductive line and contact fill step in accordance with the present invention.
Figure 14:
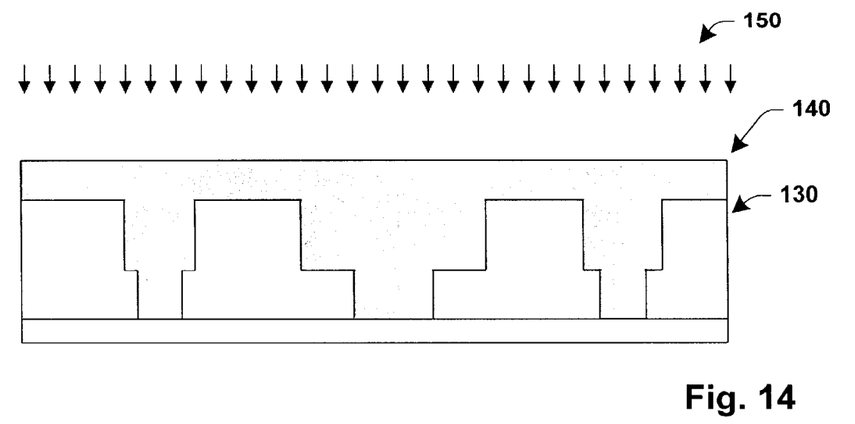
FIG. 14 is a schematic illustration of the structure of FIG. 13 undergoing a polishing step in accordance with the present invention.
Figure 15:
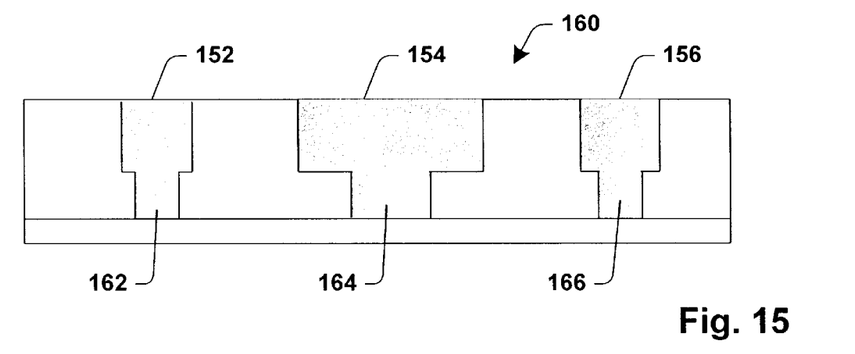
FIG. 15 is a schematic illustration of the structure of FIG. 14 after the polishing step is substantially complete in accordance with the present invention.

Thereafter, as illustrated in FIG. 13, the dual damascene structure 130 is filled with a metal 140 (e.g., aluminum, aluminum alloy, copper, copper alloy, tungsten, tungsten alloy) so as to form conductive vias and conductive lines. FIG. 14 illustrates a polished back step 150 being performed to remove a predetermined thickness of the metal layer 140. Preferably, the polished back step 150 is performed to remove an amount of the metal, equivalent to the thickness of the metal layer 140. Substantial completion of the polished back step 150 results in a dual damascene structure 160 in relevant part as illustrated in FIG. 15. The dual damascene structure 160 includes conductive lines 152, 154, and 156 and contacts 162, 164 and 166.

It is to be appreciated that the dual mask system and method of the present invention is not limited to a TFVL dual damascene process for forming conductive lines and contacts. For example, the present invention can be utilized in forming a local interconnect layer where small contacts and long trenches require different masking conditions. Furthermore, the dual mask system and method can be employed where the dual mask is dependent on the underlayer topology to optimize masking. For example, dark field masks may be employed where attenuated phase shift vary for each mask (e.g. using a high transmission mask for printing small contacts and using a binary mask for printing long trenches). Furthermore, in printing conventional metal wiring structures having long metal lines and smaller islands and landing pads, a first mask may be used for the long metal lines and a second mask used for the smaller islands and landing pads. As features become smaller, resolution and patterning fidelity will become increasingly important. The loss of throughput because of dual masks will be easily made up by the ability to print smaller features.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. For example, the dual reticle methodology described herein may also be employed with respect to patterning small and large trenches. A first reticle may be employed to pattern small trenches and a second reticle employed to pattern large trenches. Accordingly, the present invention is intended to embrace all such alterations, modifications and variations that fall within the spirit and scope of the appended claims.

What is claimed is:
1. A method of fabricating vias, comprising the steps of:
   forming a photoresist layer over a structure including at least one large trench opening and at least one small trench opening;
   patterning portions of the photoresist layer corresponding to the at least one large trench opening using a first reticle; and
   patterning portions of the photoresist layer corresponding to the small trench opening using a second reticle; and
   wherein patterning portions using a first reticle is at a first energy level and patterning portions using the second reticle is at a second energy level.

2. The method of claim 1, the first energy level being greater than the second energy level.

3. The method of claim 2, the first energy level is 200 mJ/cm$^2$ and the second energy,level is 250 mJ/cm$^2$ for an exposure wavelength of 248 nm.

4. The method of claim 1, the structure including an insulating layer disposed over a substrate.

5. The method of claim 4, the insulating material including at least one of silicon oxide, silicon dioxide, silicon nitride (Si$_3$N$_4$), (SiN), silicon oxynitride, (SiO$_x$N$_y$), fluonated silicon oxide (SiO$_x$F$_y$), and polyimide(s).

6. The method of claim 1, wherein patterning portions using a first reticle is at a first wavelength and patterning portions using the second reticle is at a second wavelength.

7. A method of fabricating vias in a trench first via last dual damascene process, comprising the steps of:

forming a photoresist layer over a layer having at least one trench of a first size and at least one trench of a second size;

patterning portions of the photoresist layer with at least one via corresponding to the at least one trench of a first size using a first reticle at a first energy; and patterning portions of the photoresist layer with at least one via corresponding to the trench opening of a second size using a second reticle at a second energy wherein the first energy level is greater than the second energy level.

8. The method of claim 7, the first energy level is less than or equal to 200 mJ/cm$^2$ and the second energy level is greater than 200 mJ/cm$^2$.

9. The method of claim 7, further including the step of etching the patterned portion of the photoresist layer into the layer.

10. The method of claim 9, the layer including at least one of silicon oxide, silicon dioxide, silicon nitride (Si$_3$N$_4$), (SiN), silicon oxynitride, (SiO$_x$N$_y$), fluonated silicon oxide (SiO$_x$F$_y$), and polyimide(s).

11. The method of claim 7, further including the step of filling the trenches and the vias with a metal to form a metal layer of conductive lines and contacts, the metal including at least one of: aluminum, aluminum alloy, copper, copper alloy, tungsten, tungsten alloy.

12. A method of fabricating small and large trenches, comprising the steps of:

forming a photoresist layer over a substrate:

using a first reticle at a first energy level to pattern portions of the photoresist layer corresponding to forming small trenches in the substrate; and using a second reticle at a second energy level to pattern portions of the photoresist layer corresponding to forming large trenches in the substrate.

* * * * *